United States Patent [19]

De Graaff et al.

[11] Patent Number: 4,697,199

[45] Date of Patent: Sep. 29, 1987

[54] SEMICONDUCTOR PROTECTION DEVICE HAVING A BIPOLAR TRANSISTOR AND AN AUXILIARY FIELD EFFECT TRANSISTOR

[75] Inventors: Hendrik C. De Graaff, Eindhoven, Netherlands; Wilhelmus G. Voncken, Hamburg, Fed. Rep. of Germany

[73] Assignee: U.S. Philips Corporation, New York, N.Y.

[21] Appl. No.: 889,288

[22] Filed: Jul. 22, 1986

Related U.S. Application Data

[63] Continuation of Ser. No. 765,615, Aug. 13, 1985, abandoned, which is a continuation of Ser. No. 625,183, Jun. 27, 1984, abandoned, which is a continuation of Ser. No. 332,895, Dec. 21, 1981, abandoned.

[30] Foreign Application Priority Data

Jan. 26, 1981 [NL] Netherlands ............ 8100347

[51] Int. Cl.[4] ............ H01L 29/78; H01L 27/06; H01L 29/72
[52] U.S. Cl. .................. 357/23.13; 357/41; 357/43; 307/200 B; 307/304
[58] Field of Search .............. 357/23.13, 41, 43; 307/200 B, 304

[56] References Cited

U.S. PATENT DOCUMENTS

| 3,395,290 | 7/1968 | Farina et al. | 357/41 |
| 3,407,339 | 10/1968 | Booher | 357/23 GP |
| 3,673,427 | 6/1972 | McCoy et al. | 357/23 GP |
| 3,754,171 | 8/1973 | Anzai et al. | 357/23 GP X |
| 4,481,521 | 11/1984 | Okumura | 357/23.13 |

FOREIGN PATENT DOCUMENTS 53-145486  12/1978  Japan ................ 357/23.13

Primary Examiner—Andrew J. James
Assistant Examiner—John Lamont
Attorney, Agent, or Firm—Robert T. Mayer; Steven R. Biren

[57] ABSTRACT

A semiconductor device has a safety device which includes an improved lateral bipolar transistor structure. The improvement is obtained by incorporating an auxiliary field effect transistor which has the emitter as its source zone and the collector as its drain zone, and in which the threshold voltage of the auxiliary field effect transistor is lower than the avalanche breakdown voltage of the collector-base junction of the lateral transistor. As a result, the lateral transistor switches sooner, at a lower voltage, to the readily conductive on-state.

9 Claims, 8 Drawing Figures

SEMICONDUCTOR PROTECTION DEVICE HAVING A BIPOLAR TRANSISTOR AND AN AUXILIARY FIELD EFFECT TRANSISTOR

BACKGROUND OF THE INVENTION

This is a continuation of application Ser. No. 765,615, filed Aug. 13, 1985, now abandoned, which is a continuation of application Ser. No. 625,183, filed June 27, 1984, now abandoned, which is a a continuation of application Ser. No. 332,895, filed Dec. 21, 1981, also now abandoned.

The invention relates to a semiconductor device comprising at least one circuit element and having a semiconductor body. The semiconductor body comprises at least a first and a second electrode, which first electrode is connected to the said circuit element, and a safety device is provided between the said first and second electrode so as to protect the first electrode from the occurrence of excess voltages above a previously determined value with respect to the voltage of the second electrode, which safety device comprises a lateral bipolar transistor having an emitter zone and a collector zone of a first conductivity type which adjoin a surface of the semiconductor body in laterally separated locations and having an adjoining base region of a second conductivity type which forms a first and a secnd p-n junction with the said emitter zone, and collector zone respectively, an insulating layer being present on the said surface of the semiconductor body, the base region between the said emitter zone and collector zone adjoining the insulating layer, the said insulating layer separating first, second and third conductive layers from the said semiconductor body, the first electrode comprising the first conductive layer which is connected to the said collector zone, the second electrode comprising the second conductive layer which is connected to the said emitter zone and the third conductive layer extending above the said base region between the said emitter zone and collector zone, and the said second junction having a breakdown voltage which is higher than the collector-emitter voltage of the lateral bipolar transistor in the conductive state of said transistor.

A semiconductor device with a safety device comprising a lateral bipolar transistor as described above is known from British Patent Specification 1,337,220.

In this known device the third conductive layer which extends above the base region is connected to the emitter zone so as to provide a "field relief electrode" to reduce the avalanche breakdown voltage of the collector junction. For that purpose the insulating layer has a thin portion at the area where the third conductive layer extends above the collector-base junction.

Since modern semiconductor devices are highly integrated, it is generally desirable for an insulated gate field effect transistor as a circuit element for such an integrated circuit to have a gate insulator which is as thin as possible so as to have good characteristics, for example, to increase mutual conductance for rapid operation and lower operating voltage. Reduction of the thickness of a gate insulator, however, will lead to a reduced dielectric breakdown voltage and will give rise to breakdown of the gate insulator during operation as a result of accidental application of high voltage pulses of static electricity.

It is therefore desirable to have a safety device which reacts extremely rapidly so as to safely conduct away excess voltage surges before the insulated gate field effect transistor will suffer from dielectric breakdown, and which as much as possible does not deteriorate the desired performance of the field effect transistor.

SUMMARY OF THE INVENTION

One of the objects of the invention is to provide an improved lateral bipolar safety transistor.

For that purpose, the semiconductor device of the kind mentioned above is characterized according to the invention in that the said first and third conductive layers are conductively connected together and both belong to the said first electrode, the third conductive layer forming a gate electrode of an auxiliary field effect transistor structure which furthermore comprises the emitter zone as source region and the collector zone as drain region, the said auxiliary field effect transistor structure having a threshold voltage which is lower than the said breakdown voltage of the second junction and which is preferably at least equal to the said collector-emitter voltage.

In the device according to the invention, the voltage at which the bipolar transistor switches from the non-conductive to the conductive state is reduced by means of the auxiliary field effect transistor and the switching speed of the bipolar safety transistor is increased. If an excess voltage occurs at the first electrode, the auxiliary field effect transistor becomes conductive before avalanche breakdown of the collector junction of the bipolar safety transistor takes place. A possible explanation for the effect of the auxiliary field effect transistor is that the conductive auxiliary field effect transistor injects charge carriers into the depletion region of the collector junction. As a result of avalanche multiplication, the injected charge carriers may result in an extra current which flows through the base region and provides a potential which is sufficient to bias the emitter junction in the forward direction and to initiate bipolar transistor action.

BRIEF DESCRIPTION OF THE DRAWING

An embodiment of the invention will now be described in greater detail with reference to the accompanying FIGS, in which.

The Figures are diagrammatic and not drawn to scale. Corresponding parts in the Figures are generally referred to by the same reference numerals.

DESCRIPTION OF THE PREFERRED EMBODIMENTS

Figure 1:
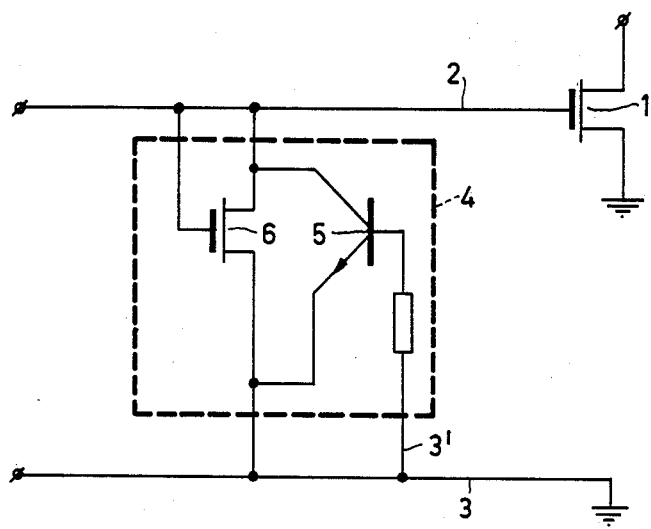
FIG. 1 shows the circuit diagram of a semiconductor device according to the invention having a lateral bipolar safety transistor.
Figure 2:
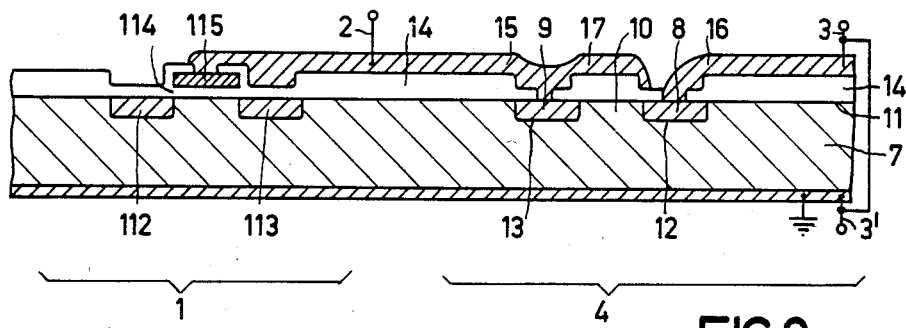
FIG. 2 is a diagrammatic cross-sectional view of the semiconductor device shown in FIG. 1.

The semiconductor device shown in FIGS. 1 and 2 has a circuit element which in the embodiment is formed by the field effect transistor 1 which is connected to a first electrode 2 which should be protected from the occurrence of excess voltages above a previously determined value with respect to the voltage of a second electrode 3, 3'. A safety device 4 is connected between the first and the second electrodes 2 and 3, 3', respectively. The safety device 4 comprises a lateral bipolar transistor 5 which according to the invention is provided with an auxiliary field effect transistor structure 6.

The semiconductor device has a semiconductor body 7 (FIG. 2) with at least a first electrode and a second electrode 2 and 3, respectively, which body is common for a number of circuit elements (only one circuit element, in this embodiment the field effect transistor 1, is shown) and for the safety device 4 which comprises the lateral bipolar transistor having a built-in auxiliary field effect transistor.

In this embodiment, the circuit element is the field effect transistor 1 which comprises a source region 112 and a drain region 113 of a first conductivity type, a thin gate insulator 114 and a gate electrode 115.

The lateral bipolar transistor provided as a safety device has an emitter zone 8 and a collector zone 9 of the first conductivity type which in laterally separated locations adjoin a surface 11 of the semiconductor body 7, and has an adjoining base region 10 of a second conductivity type which forms a first emitter p-n junction 12 and a second collector p-n junction 13, respectively, with the emitter zone and collector zone 8 and 9, respectively.

The surface 11 of the semiconductor body 7 is covered with an insulating layer 14. Between the emitter zone 8 and the collector zone 9, the base region 10 adjoins the insulating layer 14. The insulating layer 14 furthermore separates the first, second and third conductive layers 15, 16, 17 from the semiconductor body 7, which layers are present above the collector zone 9, emitter zone 8 and base region 10, respectively.

The first electrode 2 comprises the first conductive layer 15 which is conductively connected to the collector zone 9. The second electrode 3 comprises the second conductive layer 16 which is conductively connected to the emitter zone 8.

The third conductive layer 17 extends above the base region 10 between the emitter zone 8 and collector zone 9.

According to the invention, the first and third conductive layers 15, 17 are conductively connected together and both belong to the first electrode 2, the third conductive layer 17 forming a gate electrode of an auxiliary field effect transistor structure.

The auxiliary field effect transistor structure comprises the emitter zone 8 as source region and the collector zone 9 as drain region.

Figure 3:
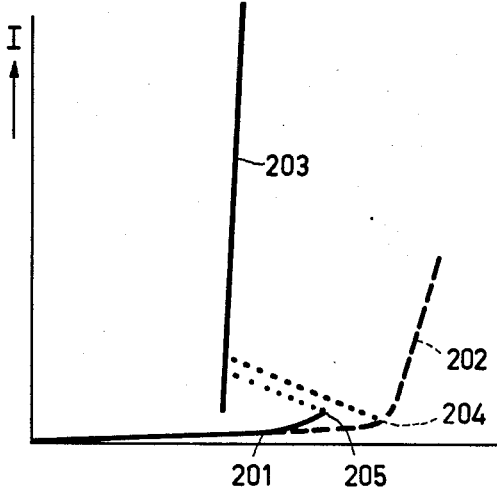
FIG. 3 shows the current-voltage characteristics of the safety device according to the invention as shown in FIG. 2, and FIGS. 4 to 8 are cross-sectional views of the device shown in FIG. 2 in various stages of its manufacture.
Figure 4:
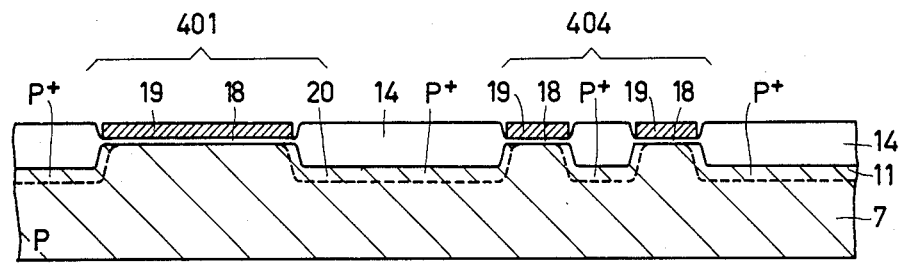
Figure 5:
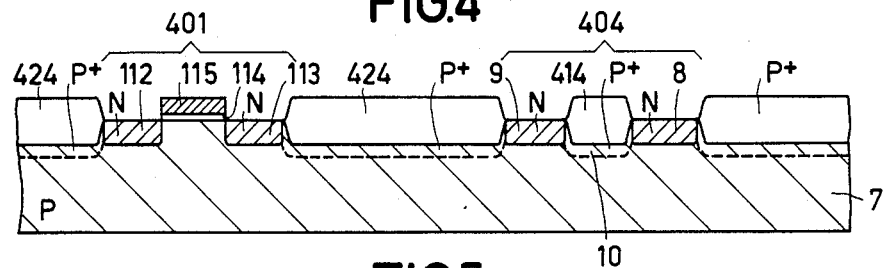

FIG. 3 shows the current-voltage characteristics of the safety device which is used in the semiconductor device shown in FIGS. 1 and 2. The Figure shows the current which flows between the first electrode 2 and the second electrode 3 and/or 3' as the voltage applied to the first electrode increases from zero in a positive direction.

With increasing voltage a small but increasing leakage current flows across the collector-base junction 13 to the electrode 3' which, for example, is connected to ground. This leakage current originates mainly from thermal generation of mobile charge carriers in the depletion region of the reversely biased collector-base junction. The leakage current increases because the thickness of the depletion region increases.

On their way through the depletion region, the generated mobile charge carriers can take up energy from the electric field. As soon as at least a few of these carriers have obtained sufficient energy, further ionization may take place so that extra mobile charge carriers are generated. The multiplication of mobile carriers further increases when the voltage increases and leads to an avalanche effect. The diode junction breaks down and the current increases rapidly. The current-voltage characteristic of the diode is shown diagrammatically in FIG. 3 by the broken-line curve 202. In the semiconductor device shown in FIG. 2 this curve 202 can be measured between the electrodes 2 and 3' if the latter is not interconnected to the electrode 3.

As a result of the presence of the emitter zone 8, however, the collector-base junction does not show a normal avalanche breakdown as is indicated by curve 202, if the electrode 3 is connected to the electrode 3'. An additional effect is that the leakage current flows to ground through the base region 10 and the substrate 7. As a result of this current and the series resistance of the base region the potential at the emitter-base junction 12 is increased. When the current through the collector-base diode increases, the voltage across the emitter-base junction 12 increases until the emitter region 8 starts to inject charge carriers (electrons) in the base 10.

At least some of these injected charge carriers will reach the depletion region associated with the collector-base junction. Normal bipolar transistor action begins to occur and the safety device switches to the readily conductive state (the on-state) indicated by curve 203 in FIG. 3. So once the voltage across the safety device has reached a value denoted by point 204, the device enters a transition state, which is shown diagrammatically by dots in FIG. 3, and switches to the on-state of curve 203. The injected charge carriers which reach the collector-base depletion region join the thermally generated charge carriers so that more charge carriers are available in the depletion region and more charge carriers become involved in a multiplication process. The result is that at a lower voltage across the collector-base junction a sufficient number of holes can nevertheless be formed to produce the necessary base current and to maintain the forward voltage across the emitter-base junction.

The current level at which the bipolar transistor switches to the on-state depends inter alia on the series resistance in the base region and the location of the conductive contact with said base region. Such a conductive base contact may be provided on the lower side of the substrate 7 (electrode 3' in FIG. 2) or in known manner on the upper surface 11 of the semiconductor body.

It is to be noted that although it is preferred to provide the base region with a conductive base contact, the safety transistor will operate similarly when the base region is kept floating. With a floating base region the leakage current of the collector-base junction will charge the base region so that the potential thereof increases until the voltage across the emitter-base junction has been increased sufficiently to initiate the transistor action. With a floating base region a voltage is measured between the electrodes 3 and 2 in the on-condition, which in bipolar transistors is generally denoted by $BV_{CEO}$.

From the above it will be clear that the avalanche breakdown voltage of the collector-base junction (the voltage at point 204 in FIG. 3) is higher than the collector-emitter voltage of the lateral bipolar transistor in the conductive or on-state (curve 203). In a practical safety device it has been found that the avalanche breakdown voltage was approximately 20 Volts and the collector-emitter voltage in the on-state was approximately 12 Volts.

According to the invention, the known lateral bipolar-transistor is improved by an incorporated auxiliary field effect transistor to which the excess voltage is applied between its gate electrode and its source region. The threshold voltage of the auxiliary field effect transistor is chosen to be lower than the avalanche breakdown voltage of the collector-base junction. When the voltage increases the auxiliary field effect transistor will thus become conductive at the instant at which the threshold voltage is reached and before avalanche breakdown of the collector-base junction occurs. Electrons will flow through the auxiliary transistor from the emitter/source region into the field effect transistor channel and to the depletion region of the collector/base junction (drain-substrate junction). At least a part of the electrons will produce a multiplication process and will generate both new electrons and new holes. The electron flow assists in draining a part of the excess voltage and the associated electric charge. More importantly, however, the current through the auxiliary field effect transistor results in extra generation of holes. These holes will flow to ground via the base region 10. In terms of the above explanation of the lateral bipolar safety transistor and its action the hole current thus produces extra leakage current through the collector-base junction.

At voltages higher than the threshold voltage of the auxiliary field effect transistor (point 201 in FIG. 3) the current through the safety device according to the invention increases more rapidly than in a lateral safety transistor of a conventional structure. The improved safety transistor enters the transition state at a lower voltage (point 205 in FIG. 3) and then switches (again shown diagrammatically by dots) to the on-state of the lateral bipolar transistor indicated by curve 203. The auxiliary field effect transistor provides an extra base current source and thus increases the switching speed of the bipolar transistor with which said transistor changes from the off or blocked state to the on or readily conducting state. The actual switching occurs at a lower voltage level. In the above-indicated device in which the lateral bipolar transistor switched on at approximately 20 Volts, the addition of the auxiliary field effect transistor resulted in an improved switching at approximately 17 Volts.

For completeness' sake it is to be noted that the above serves for illustration as a possible explanation of the operation of the semiconductor device according to the invention. The object of this possible explanation is not to restrict the invention to the occurrence of the phenomena indicated therein. By using the invention an improved lateral bipolar transistor is obtained which by incorporating an auxiliary field effect transistor switches to the on-state at a lower voltage than would be the case without this auxiliary field effect transistor. The presence of said auxiliary field effect transistor brings substantially no change in, for example, the avalanche breakdown voltage of the collector-base junction of the bipolar transistor.

The above-mentioned preferred embodiment of the semi-conductor device with a safety device according to the invention can be manufactured in the same semiconductor body together with other circuit elements, for example, field effect transistors, diodes and resistors, without requiring extra steps.

The steps for the manufacture of the safety device of the invention will now be described briefly with reference to the accompanying FIGS. 4 to 8 which are diagrammatic crosssectional views of the semiconductor device in various stages of its manufacture.

The starting material is a semiconductor body 7, for example, a silicon substrate of the p-conductivity type having a resistivity of, for example, approximately 10 ohm.cm. A surface 11 of the substrate 7 is covered with a layer masking against ion implantation and oxidation. This layer comprises an approximately 400 Å thick silicon oxide film 18 and an approximately 750 Å thick silicon nitride film 19 which are provided in the usual manner, for example, by chemical deposition from the vapor phase. An aperture is then formed in the masking layer 18, 19, in which aperture a highly doped zone 20 of the p-conductivity type is provided by boron implantation at 30 keV with a dose of $2.4 \times 10^{13}$ cm$^{-2}$. A thick insulation layer 14 of silicon oxide, thickness approximately 0.5 micron, which is sunk in the substrate over at least a part of its thickness, is obtained by thermal oxidation (see FIG. 4). The silicon oxide layer 14 comprises a portion 424 for field passivation and a portion 414 which is destined for the field effect transistor of the safety device. The highly doped zone 20 of the p-conductivity type serves to prevent the formation of undesired channels below the field oxide 424 during operation of the semiconductor device. The masking layer comprising the silicon nitride film 19 and the silicon oxide film 18 is removed at least partly so that the surface 11 of the semiconductor body is exposed selectively in regions where semiconductor zones for the circuit element 1 and the safety device 4 are to be provided (see FIG. 5).

The first region 401 of the semiconductor body is destined for providing circuit elements, in this embodiment the field effect transistor 1.

The second region 404 of the semiconductor body is destined for the safety device 4. The second region 404 has two exposed parts which are destined for providing an emitter zone and a collector zone of the lateral bipolar transistor 5.

Between said two exposed parts is present the portion 414 of the thick silicon oxide layer 14 which is to form part of the thick gate insulation layer of the auxiliary field effect transistor 6.

In the first region 401 are formed a thin gate insulator 114 comprising an approximately 500 Å thick silicon oxide layer provided by thermal oxidation and a gate electrode 115 comprising an approximately 0.4 micron thick polycrystalline silicon layer provided by deposition, while using conventional methods. The silicon gate electrode is highly doped with phosphorus (see FIG. 5).

A doping impurity to provide the n-conductivity type is introduced into the exposed surface parts of the substrate 7 in regions 401, 404 for the simultaneous formation of the source region 112 and the drain region 113 of the field effect transistor 1 and the emitter zone and collector zone 8, 9 of the bipolar transistor 5. In this example the gate electrode 115 is also exposed to said doping operation.

In this example the doping impurity providing the n-conductivity type comprises arsenic. In this treatment arsenic ions are implanted while using an energy of 100 KeV and a dose of $5 \times 10^{15}$ cm$^{-2}$ (see FIG. 5).

The semiconductor body is then subjected to a thermal treatment so as to activate the implanted dopant.

Figure 6:
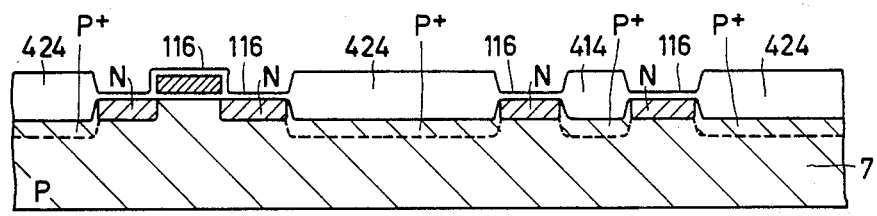

During the thermal treatment an approximately 0.1 micron thick thermally grown silicon oxide layer 116 is formed on the exposed surface of the polycrystalline silicon gate electrode layer 115 and on exposed surfaces of the doped regions of the n-conductivity type (see FIG. 6).

Figure 7:
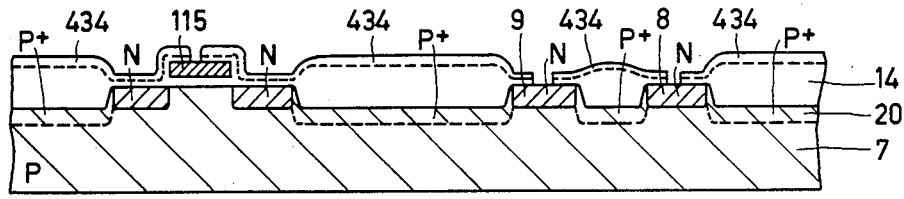
Figure 8:
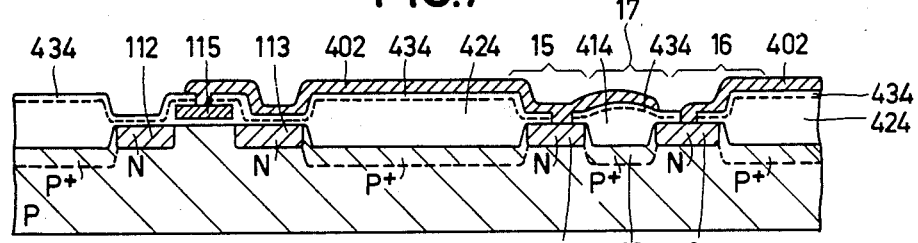

A silicon oxide layer 434, approximately 0.4 micron thick, is provided on the whole surface of the semiconductor body by chemical deposition from the vapor phase (see FIG. 7).

After the formation of contact holes to expose surface parts of the gate electrode 115, the emitter zone 8 and the collector zone 9, a conductive layer 402 is provided on the surface of the semiconductor body by deposition from the vapor phase. A metal layer, for example, an aluminum layer, may be used for the layer 402. The metal layer 402 is patterned so as to form a connection pattern comprising a first conductive layer 15 (see FIG. 8) on the collector zone 9, a second conductive layer 16 on the emitter zone 8 and a third conductive layer 17 on the thick gate insulation layer 414. The first and third conductive layers 15, 17 are conductively connected together and both belong to the first electrode 2 which is shown in FIG. 1 and which is connected to the gate electrode 115 of the field effect transistor 1.

The second conductive layer 16 is conductively connected to the emitter zone 8 of the bipolar safety transistor 5 and belongs to the second electrode 3 which is shown in FIG. 1. This electrode 3 may be connected to a reference potential, for example, ground. However, the safety transistor will also limit the potential difference between the electrodes 2 and 3 to safe values without external connection of the electrode.

Within the scope of the present invention it is advantageous for the safety device to be obtained without extra steps in the manufacturing process. The safety device is provided by means of the same method as the circuit element. The emitter and collector zones 8, 9 of the bipolar transistor and the source and drain regions 112, 113 of the field effect transistor are simultaneously formed.

The thin gate insulator 114 and the gate electrode 115 of the field effect transistor are provided in accordance with previously determined characteristics of the circuit element by means of conventional methods, for example, thermal oxidation and deposition. The portion 414 of the thick gate insulation layer of the safety device 4 and the portion 424 of the field oxide layer furthermore are formed simultaneously by thermal oxidation while using the silicon nitride film 19 as a mask.

The reason why portion 414 is used as a sub-layer of the gate insulating layer of the auxiliary field effect transistor is that the threshold voltage of said auxiliary field effect transistor should be sufficiently high to prevent the safety device forming a leakage path between said electrodes 2 and 3 when normal operating voltages are applied to the electrodes 2 and 3. During normal operation of the integrated circuit in question the safety device should be in the off-state. This will be the case, for example, when the threshold voltage of the auxiliary transistor and the voltage at which the safety device switches to the on-state (point 205 in FIG. 3) are higher than the supply voltage of the integrated circuit. These two voltages are preferably each approximately equal to or at least equal to the (preferably smallest) threshold voltage for parasitic channel formation in the field oxide region (below the insulating layer 14; 424; 434). In the example described, the threshold voltage for parasitic channel formation below polycrystalline silicon tracks provided simultaneously with the gate electrode 115 but present on the thermal oxide 424 was approximately 12 volts.

In a preferred form of the safety device in accordance with the invention, the collector-emitter voltage of the safety device in the on-state (curve 203 in FIG. 3) is also higher than the supply voltage. In that case the safety device will automatically return to the off-state after dissipation of an excess voltage surge.

It is advantageous for the auxiliary field effect transistor to be conductive only when the collector-base voltage is high enough to enable the occurrence of multiplication in the depletion layer. In this regard the threshold voltage of the auxiliary field effect transistor is preferably at least equal to the collector-emitter voltage of the safety device in the on-state.

The thickness of the insulating layer or layers present in the safety device should preferably be larger than the thickness of the thinnest part of the insulating layer which is present below the conductive layers of electrode 2. In other words, the insulating layer portion of the safety device should preferably withstand higher voltages than any dielectric and/or insulating layer portion which is to be protected against electrical breakdown.

Although it would be possible to use a polysilicon gate in the auxiliary field effect transistor, the structure of the embodiment described is to be preferred. If a silicon gate is provided simultaneously with silicon gate 115, the threshold voltage of the auxiliary field effect transistor will be lower than in the preferred embodiment and probably lower than is necessary or desirable. Not counting this, however, another problem is prevented by using a double layer 414, 434 as a gate dielectric. As is generally known, locally thermally grown oxide layers have the tendency of showing the so-called bird beak at the oxide edge. Furthermore, gate electrode 17 should preferably bridge the whole gap between the emitter and collector zones 8, 9 so as to be sure that an excessive voltage will induce a conductive channel in a controlled manner which connects the source region 8 readily with the depletion region of the drain region 9. Consequently, it is nearly inevitable that the polysilicon gate will extend on the thin oxide of the bird beak. As already described above, the presence of such thin oxide layers in the safety device may seriously endanger the reliability of the safety device. For this and other reasons it is preferred to provide the gate electrode 17 of the auxiliary field effect transistor simultaneously with the conductor tracks which are present at a second connection level of the integrated circuit, which tracks may be used to contact the gate electrode 115 and the semiconductor zones 8, 9, 112 and 113. In that case, the insulating layer which separates the conductive tracks of the first and second connection level from each other may be used to form a sub-layer of the gate dielectric of the auxiliary field effect transistor. As shown in the example, the gate dielectric is composed of two insulating layers 414 and 434, respectively, the sublayer 414 being grown thermally and the sub-layer 434 being deposited.

The double layer dielectric 414, 434 is also used with a view to the threshold voltage which is desired for the auxiliary field effect transistor and which is comparatively high as compared with, for example, the threshold voltage of field effect transistor 1. The threshold voltage of the auxiliary transistor may further be increased by using a more highly doped zone in the base zone 10 below the insulating layer 414, 434 and the gate electrode 17. As in the example, such a highly doped zone may be provided simultaneously with the channel stopper region 20 below the field oxide. However, it is also possible to adjust the threshold voltage of the auxilary field effect transistor at a desired value by means of a special implantation treatment.

In the case in which the more highly doped zone in the base region 10 extends along the semiconductor surface up to the collector region 9, the collector-base avalanche breakdown voltage will be reduced. This is a suitable means to shift point 204 and also point 205 of FIG. 3 towards lower voltages.

The more highly doped zone as used in the safety device of the example provides both an increase of the threshold voltage and a decrease of the avalanche breakdown voltage and switching voltage. The threshold voltage can be increased independently by the selective provision of a p-type dopant near the source region, for example, by introduction of such a dopant through the same window as is used to obtain the emitter region 8. Similarly the avalanche breakdown voltage and the switching voltage can be reduced nearly independently of the threshold voltage by the selective provision of a p-type dopant near the collector zone 9. In the latter case the more highly doped p-type zone is preferably provided so as to adjoin the collector-base junction and in such manner that the more highly doped zone will be depleted entirely or nearly entirely when voltages which are approximately equal to or higher than the collector-emitter voltage of the lateral bipolar transistor are applied. In other words: in the on-state of the safety device the more highly doped zone is preferably present within the depletion region of the collector-base junction so that the more highly doped zone does not extend or substantially does not extend in the actual channel region of the auxiliary field effect transistor.

It will be apparent that the invention is not restricted to the example described and that many variations are possible to those skilled in the art without departing from the scope of this invention. For example, the safety device may also be used to protect output electrodes and/or supply electrodes of semiconductor devices from excess voltages. Furthermore, the base region 10 is not necessarily formed by a part of the substrate region 7. In the case of an integrated circuit with complementary field effect transistors, for example, the base region 10 may be formed by a p-type island region (also termed tub or well) similar to the island regions which are used to provide the n-channel transistors therein.

If desirable, the collector region 9 may be connected to electrode 2 (conductive layer 15 or 402) via a resistor of, for instance, about 200Ω. In that case the gate electrode 17 of the auxiliary field effect transistor still may be connected directly to electrode 2. The effect of such resistor is that upon the occurrence of rapidly rising voltage surges at electrode 2, the gate-to-source voltage of the auxiliary field effect transistor will rise faster than the collector-to-base (or collector-to-emitter) voltage of the lateral bipolar transistor. In this manner it may be ensured that the auxiliary field effect transistor switches to its readily conducting state prior to the occurrence of breakdown at the collector-base-junction of the lateral bipolar transistor. For example, the resistor may be integrated as a diffused resistor or as a polycrystalline silicon resistor.

The conductivity types are given only by way of example and may be interchanged. Other materials may also be used. The semiconductor material may also consist, for example, of germanium or an $A_{III}$-$B_V$ compound. Silicon nitride or aluminum oxide may be used as an insulating layer. The insulating layer in the field region may be obtained by means of conventional methods other than local oxidation. The polysilicon tracks may be provided with a suitable metal silicide or they may be replaced by a suitable metal silicide.

What is claimed is

1. A semiconductor device comprising at least one circuit element and having a semiconductor body with a major surface, in which said semiconductor body comprises at least a first and a second electrode, which first electrode is connected to said circuit element, and in which a safety device is provided between said first and second elecrodes to protect the first electrode from excess voltages above a previously-determined value with respect to the voltage of the second electrode, said safety device comprising a lateral bipolar transistor having an emitter zone and a collector zone of a first conductivity type which adjoin said surface of the semiconductor body and are laterally separated, and having an adjoining base region of a second conductivity type which forms a first and a second p-n junction with said emitter zone and collector zone, respectively, an insulating layer on said surface of the semiconductor body, the base region being located between the emitter zone and collector zone and adjoining the insulating layer, first, second and third conductive layers on said insulating layer and separated thereby from said semiconductor body, the first electrode comprising said first conductive layer which is connected to the collector zone, the zone electrode comprising the second conductive layer which is connected to the emitter zone, and the third conductive layer extending above the base region between the emitter zone and collector zone, and the second junction having a breakdown voltage which is higher than the collector-emitter voltage of the lateral bipolar transistor in the conductive state, the first and third conductive layers being connectively connected together and forming parts of said first electrode, the third conductive layer also forming a gate electrode of an auxiliary field effect transistor structure which further comprises the emitter zone of said bipolar transistor as its source region and the collector zone of said bipolar transistor as its drain region, and the auxiliary field effect transistor structure having a threshold voltage which is lower than the breakdown voltage of the second junction and which is at least about equal to said collector-emitter voltage, said safety device comprising means including said bipolar transistor for providing a current-versus-voltage characteristic measured between the first and second electrodes having a first and a second part, the first part corresponding to a first state of relatively low current conduction of the device, which first part, with increasing voltage, extends up to a first voltage value which is higher than said collector-emitter voltage of the lateal transistor in the conductive state of said transistor, and the second part corresponding to a second state of relatively high current conduction by said bipolar transistor of the device, which second state occurs only after said first voltage value has been reached, said second part, with decreasing current, extending down to a voltage below said first voltage level, and further comprising a first zone of the second conductivity type which is located in said semiconductor body adjoining the insulating layer, is present at least locally below said layer, and is located outside the area occupied by the circuit element and outside the area occupied by the safety device, and a second surface-adjoining zone of the second conductivity type located in said semiconductor body between said emitter zone and said collector zone, said first and second zones being more highly doped than the adjoining part of the semiconductor body.

2. A semiconductor device as claimed in claim 1, characterized in that said circuit element comprises a field effect transistor structure which comprises source and drain regions of the first conductivity type, a thin gate insulation layer and a gate electrode.

3. A semiconductor device as claimed in claim 2, characterized in that above the base region between the collector zone and the emitter zone of the safety device the insulating layer forms a thick gate insulation layer, the thickness of which exceeds that of the thin gate insulation layer of the circuit element by a factor of about ten and is at most equal to the thickness of the insulating layer below the first and second conductive layers.

4. A seiconductor device as claim in claim 3, characterized in that the gate electrode of the circuit element comprises a fourth conductive layer which is covered at least partly with said insulating layer, said insulating layer comprising a portion which is present between the third conductive layer and the base region, said portion forming a sub-layer of the thick gate insulation layer, said thick gate insulation layer being about 0.5 micron thick and said thin gate insulation layer being about 500 Angstroms thick.

5. A semiconductor device as claimed in claim 3 or 4, characterized in that said gate insulation layer of the safety device comprises at least a sub-layer obtained by thermal oxidation and a sub-layer obtained by deposition.

6. A semiconductor device as claimed in claim 1 or 2, characterized in that the base region has a collector-zone-adjoining more highly doped zone of the second conductivity type which is more highly doped than the remaining part of the base region.

7. A semiconductor device as claimed in claim 1 or 2, characterized in that the threshold voltage of the auxiliary field effect transistor is at least equal to the supply voltage to be applied to the semiconductor device during operation.

8. A semiconductor device as claimed in claim 1 or 2, characterized in that the threshold voltage of the auxiliary field effect transistor is substantially equal to the threshold voltage for parasitic channel formation in regions of the surface of the semiconductor body not occupied by circuit elements.

9. A semiconductor device as claimed in claim 1 or 2 characterized in that the threshold voltage of the auxiliary field effect transistor is at least equal to the threshold voltage for parasitic channel formation in regions of the surface of the semiconductor body not occupied by circuit elements.

* * * * *